(12) United States Patent
Rocklein et al.

(10) Patent No.: US 10,985,239 B2
(45) Date of Patent: Apr. 20, 2021

(54) OXIDATIVE TRIM

(71) Applicant: Micron Technology, Inc., Boise, ID (US)

(72) Inventors: Matthew N. Rocklein, Boise, ID (US); An-Jen B. Cheng, Boise, ID (US); Fredrick D. Fishburn, Aptos, CA (US); Sevim Korkmaz, Boise, ID (US); Paul A. Paduano, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/543,065

(22) Filed: Aug. 16, 2019

(65) Prior Publication Data
US 2021/0050409 A1    Feb. 18, 2021

(51) Int. Cl.
*H01L 49/02* (2006.01)
*H01L 21/285* (2006.01)
*H01L 21/311* (2006.01)
*H01L 21/02* (2006.01)

(52) U.S. Cl.
CPC ........ *H01L 28/82* (2013.01); *H01L 21/02244* (2013.01); *H01L 21/02252* (2013.01); *H01L 21/28568* (2013.01); *H01L 21/31111* (2013.01); *H01L 21/31116* (2013.01)

(58) Field of Classification Search
CPC ............... H01L 28/82; H01L 21/02244; H01L 21/02252; H01L 21/28568; H01L 21/31111
See application file for complete search history.

(56) References Cited

U.S. PATENT DOCUMENTS

| | | | |
|---|---|---|---|
| 6,974,989 B1 * | 12/2005 | Chen | ................. H01L 27/115 257/296 |
| 7,662,693 B2 | 2/2010 | Bhattacharyya | |
| 7,875,529 B2 | 1/2011 | Forbes et al. | |
| 8,274,777 B2 | 9/2012 | Kiehlbauch | |
| 10,002,873 B2 * | 6/2018 | Hong | ................. H01L 21/31111 |

* cited by examiner

*Primary Examiner* — Marc Anthony Armand
(74) *Attorney, Agent, or Firm* — Brooks, Cameron & Huebsch, PLLC

(57) ABSTRACT

Methods, apparatuses, and systems related to trim a semiconductor structure using oxygen are described. An example method includes forming a support structure for a semiconductor structure having a first silicate material on a working surface. The method further includes forming a first nitride material on the first silicate material. The method further includes forming a second silicate material on the first nitride material. The method further includes forming a second nitride material on the second silicate material. The method further includes forming an opening through the semiconductor structure. The method further includes depositing an electrode material within the opening. The method further includes removing portions of the support structure. The method further includes performing a controlled oxidative trim to an upper portion of the electrode material.

26 Claims, 9 Drawing Sheets

OXIDATIVE TRIM

TECHNICAL FIELD

The present disclosure relates generally to semiconductor devices and methods, and more particularly to an oxidative trim.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), static random access memory (SRAM), synchronous dynamic random access memory (SDRAM), ferroelectric random access memory (FeRAM), magnetic random access memory (MRAM), resistive random access memory (ReRAM), and flash memory, among others. Some types of memory devices may be non-volatile memory (e.g., ReRAM) and may be used for a wide range of electronic applications in need of high memory densities, high reliability, and low power consumption. Volatile memory cells (e.g., DRAM cells) require power to retain their stored data state (e.g., via a refresh process), as opposed to non-volatile memory cells (e.g., flash memory cells), which retain their stored state in the absence of power. However, various volatile memory cells, such as DRAM cells may be operated (e.g., programmed, read, erased, etc.) faster than various non-volatile memory cells, such as flash memory cells.

DETAILED DESCRIPTION

Figure 1:
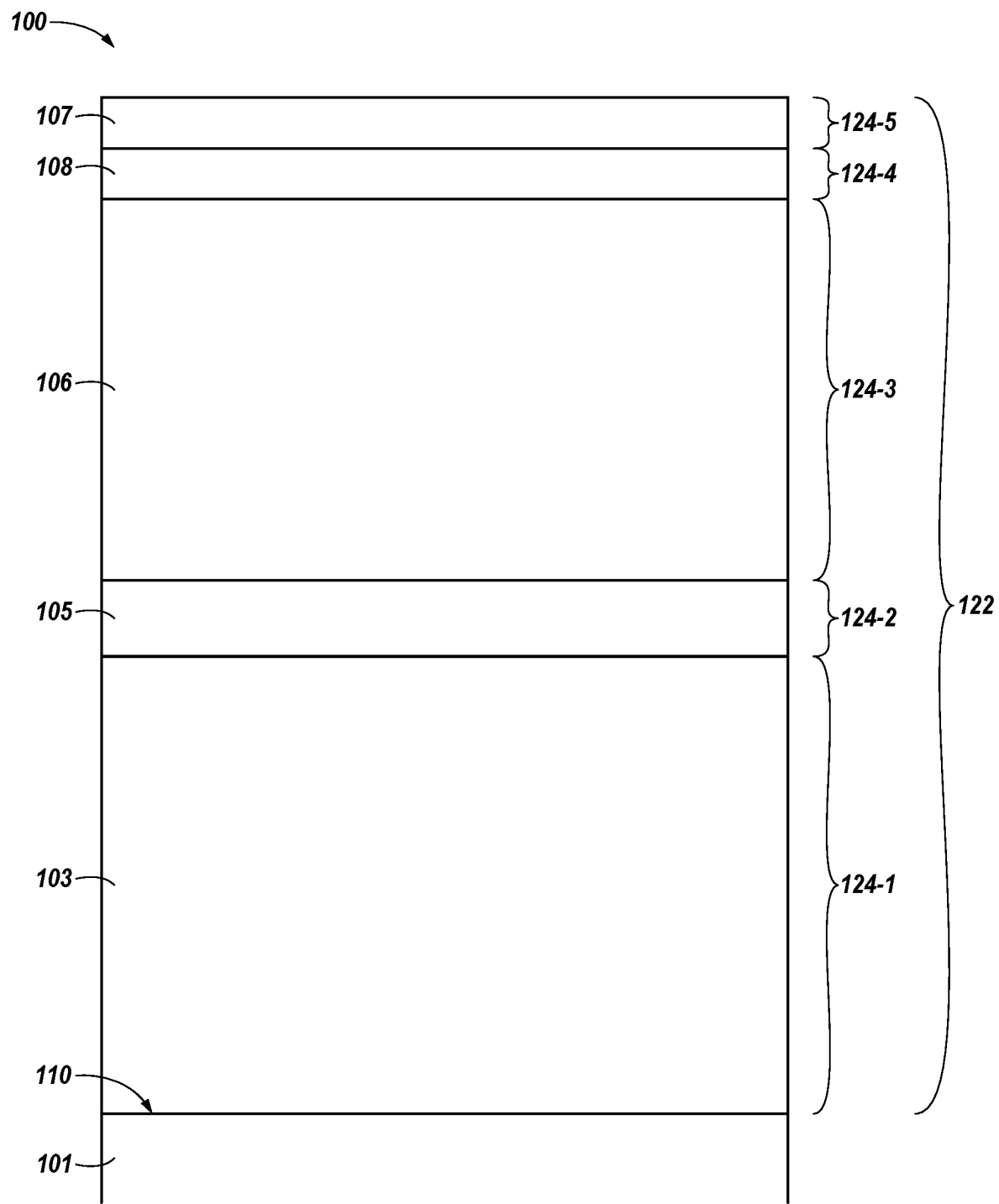
FIGS. 1-6 illustrate cross-sectional views of a portion of a semiconductor structure of a memory device in association with a semiconductor fabrication sequence for trimming a semiconductor structure using oxygen in accordance with a number of examples of the present disclosure.

Various types of semiconductor structures on memory devices (e.g., those that include volatile or non-volatile memory cells) may include rectilinear trenches and/or round, square, oblong, etc., cavities that may be formed into semiconductor material to create openings thereon for subsequent semiconductor processing steps. Various materials may be deposited using chemical vapor deposition (CVD), plasma deposition, etc. and patterned using photolithographic techniques, doped and etched using vapor, wet and/or dry etch processes to form semiconductor structures on a working surface. Such openings may contain, or be associated with, various materials that contribute to data access, storage, and/or processing, or to various support structures, on the memory device. As an example, capacitor material may be deposited into these openings to provide the data access, storage, and/or processing.

In order to increase the capacitance of a cell of the memory device, a surface area of a semiconductor working surface formed into a column can be increased by increasing the height of the capacitor material column within the openings. However, as capacitor columns increase in height with pillars having higher aspect ratios, it may require more etching which can create tapering at the bottom of the capacitor columns, can increase the risk of bending and wobbling of the capacitor column, and can cause possible shorts. Subsequent dry etches to straighten the high aspect ratio capacitor column may increase the risk of an uneven structure including bulging at the top of the capacitor column, which decreases the space between capacitor structures.

In order to mitigate this issue, a method for trimming a semiconductor structure using oxygen is described further below. As an example, a dry etch may be used to form the pillars. An electrode material may be deposited within a resulting opening. The dry etch may cause a bulge to form on the upper portion of the electrode material. The bottom portion of the electrode material may also experience tapering. A controlled oxidative trim may be performed on the electrode material to etch away the bulge on the upper portion of the electrode material. A wet etch may then be performed to etch away the resultant oxidation product.

The present disclosure includes methods, apparatuses, and systems related to trim a semiconductor structure using oxygen, resulting in increased pitch/space between capacitors and poor electrical conduction. For example, in a previous approach, a dry etch may cause underetch or pinch issues in a high aspect ratio structure. The longer the dry etch, the less the structure control starting at the top of the semiconductor structure. As such, reduced space between capacitors and shorts may occur. Here, an oxidative trim is performed on the electrode material to etch away the underetch and bulges that form disproportionately on an electrode material In one example, the capacitor column may be straightened by an oxidative trim after the dry etch process. An example of a method described herein includes forming a support structure for a semiconductor structure having a first silicate material on a working surface. The method further includes forming a first nitride material on the first silicate material. The method further includes forming a second silicate material on the first nitride material. The method further includes forming a second nitride material on the second silicate material. The method further includes forming an opening through the semiconductor structure. The method further includes depositing an electrode material within the opening. The method further includes removing portions of the support structure. The method further includes performing a controlled oxidative trim to an upper portion of the electrode material.

In the following detailed description of the present disclosure, reference is made to the accompanying drawings that form a part hereof, and in which is shown by way of illustration how one or more examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the present disclosure. As used herein, "a number of" something can refer to one or more such things. For example, a number of capacitors can refer to at least one capacitor.

The figures herein follow a numbering convention in which the first digit or digits correspond to the figure number of the drawing and the remaining digits identify an element or component in the drawing. Similar elements or components between different figures may be identified by the use of similar digits. For example, reference numeral 108 may reference element "08" in FIG. 1, and a similar element may be referenced as 208 in FIG. 2. In some instances, a plurality of similar, but functionally and/or structurally distinguishable, elements or components in the same figure or in different figures may be referenced sequentially with the same element number (e.g., 124-1, 124-2, 124-3, 124-4 in FIG. 1).

FIG. 1 illustrates a cross-sectional view 100 of a portion of a semiconductor structure of a memory device in association with a semiconductor fabrication sequence for trimming a semiconductor structure using oxygen in accordance with a number of examples of the present disclosure. The example semiconductor support structure may include a first silicate material 103, shown to have been formed over an underlying working surface 101. The working surface 101 may be formed from various undoped or doped materials on which memory device materials may be fabricated. Examples of a relatively inert undoped working surface 101 may include monocrystalline silicon (monosilicon), polycrystalline silicon (polysilicon), and amorphous silicon, among other possibilities.

The first silicate material 103 may, in a number of examples, have been formed from borophosphosilicate glass (BPSG). The BPSG may include a silicon compound doped with various concentrations and/or ratios of a boron compound and a phosphorus compound. The silicon compound may be silicon dioxide ($SiO_2$), which may be formed by oxidation of silane ($SiH_4$), among other possibilities. The boron compound may be diboron trioxide ($B_2O_3$), which may be formed by oxidation of diborane ($B_2H_6$), among other possibilities. The phosphorus compound may be diphosphorus pentoxide ($P_2O_5$), which may be formed by oxidation of phosphine ($PH_3$), among other possibilities. The silicon, boron, and phosphorus compounds of the BPSG may include various isotopes of silicon, boron, and phosphorus, as determined to be appropriate for functionality, and/or formation of the first silicate material 103, as described herein.

The first silicate material 103 may be originally formed (e.g., deposited) over a surface of the underlying working surface 101. For example, the first silicate material 103 may be formed without an opening formed therein from an upper surface of the first silicate material 103 to the surface of the underlying working surface 101. The first silicate material 103 may, in a number of examples, be deposited to a thickness in a range of approximately 200 nanometers (nm) to approximately 600 nm above the surface of the underlying working surface 101. However, embodiments of the present disclosure are not limited to this example.

A first nitride material 105 may be formed over a surface of the first silicate material 103 opposite from the underlying working surface 101. The first nitride material 105 may be formed (e.g., deposited) over an upper surface of the first silicate material 103. The first nitride material 105 may be formed from a nitride material selected for dielectric properties. For example, one or more dielectric nitrides may be selected from silicon nitride ($SiN_x$, $Si_3N_4$), aluminum nitride (AlN), among other possibilities, for formation of the first nitride material 105. The first nitride material 105 may, in a number of examples, be deposited to a thickness in a range of approximately 5 nm to approximately 60 nm above the surface of the first silicate material 103. However, embodiments of the present disclosure are not limited to this example.

A second silicate material 106 is shown to have been formed over a surface of the first nitride material 105 opposite from the first silicate material 103. The second silicate material 106 may, in a number of examples, be formed from tetraethyl orthosilicate ($Si(OC_2H_5)_4$), which is also referred to as TEOS. TEOS may be formed as an ethyl ester of orthosilicic acid ($Si(OH)_4$), among other possibilities. The second silicate material 106 may, in a number of examples, be deposited to a thickness in a range of approximately 250 nm to 450 nm above the surface of the first nitride material 105. However, embodiments of the present disclosure are not limited to this example.

A second nitride material 108 is shown to have been formed over a surface of the second silicate material 106 opposite from the first nitride material 105. The second nitride material 108 may be formed (e.g., deposited) over an upper surface of the second silicate material 106.

Similar to the first nitride material 105, the second nitride material 108 may be formed from a nitride material selected for dielectric properties. For example, the second nitride material 108 may be formed from the same material as the first nitride material 105. The second nitride material 108 may, in a number of examples, be deposited to a thickness in a range of from approximately 20 nm to approximately 100 nm above the surface of the second silicate material 106.

A hard mask material 107 is shown to have been formed over a surface of the second nitride material 108 opposite from the second silicate material 106. The hard mask material 107 may, in a number of examples, be formed from a silicon material. The hard mask material 107 may, in a number of examples, be formed from a polycrystalline silicon (polysilicon), among other possibilities. The hard mask material 107 may, in a number of examples, be deposited to a thickness in a range of approximately 50 nm to 400 nm above the surface of the second nitride material 108. However, embodiments of the present disclosure are not limited to this example. The hard mask material 107 may be used to protect the pattern of materials below during an etch process to form pillars. The hard mask material 107 may be patterned and etched, e.g., using a reactive ion etch (RIE) process to form the pillars.

Each of the materials may contribute a particular height to the overall height 122 of the structure. As is illustrated in FIG. 1, the first silicate material 103 can have a height 124-1, the first nitride material 105 can have a height 124-2, the second silicate material 106 can have a height 124-3, the second nitride material 108 can have a height 124-4, and the hard mask material 107 can have a height 124-5 that, when added together, results in the overall height 122.

In some examples, the height 124-1 of the first silicate material 103 can be one of approximately 2000 Angstroms, approximately 2400 Angstroms, approximately 3600 Angstroms, approximately 4000 Angstroms, approximately 4200 Angstroms, approximately 4500 Angstroms, approximately 4900 Angstroms, approximately 5300 Angstroms, approximately 5700 Angstroms, and/or within a range from approximately 2000 Angstroms to approximately 6000 Angstroms. In some examples, the height 124-2 of the first nitride material 105 can be one of approximately 50 Angstroms, approximately 100 Angstroms, approximately 400 Angstroms, approximately 550 Angstroms, and/or within a range from approximately 50 to approximately 600 Angstroms. In some examples, the height 124-3 of the second silicate material 108 can be one of approximately 2500 Angstroms, approximately 3500 Angstroms, approximately 4200 Angstroms, and/or within a range from approximately 2500 to 4500 Angstroms. In some examples, the height 124-4 of the second nitride material 108 can be one of approximately 200 Angstroms, approximately 750 Angstroms, approximately 970 Angstroms, and/or within a range from approximately 200 to approximately 1000 Angstroms. In some examples, the height 124-5 of the hard mask material 107 can be one of approximately 50 Angstroms, approximately 100 Angstroms, approximately 400 Angstroms, and/or within a range from approximately 50 to approximately 400 Angstroms. However, embodiments of the present disclosure are not limited to this example.

Figure 2:
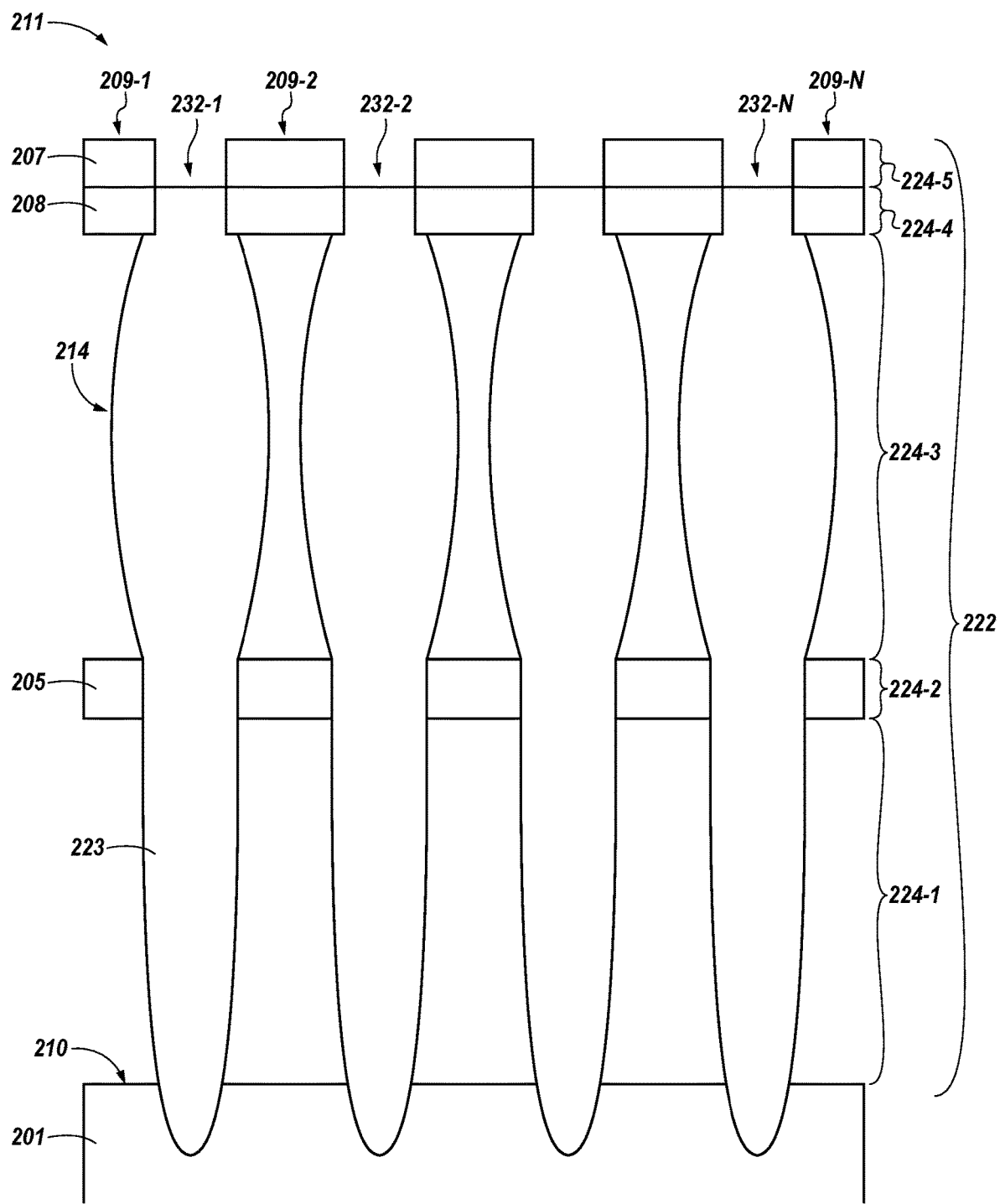

FIG. 2 illustrates a cross-sectional view 211 of a portion of semiconductor structure of a memory device in association with a semiconductor fabrication sequence for trimming a semiconductor structure using oxygen in accordance with a number of examples of the present disclosure. FIG. 2 illustrates the example semiconductor structure at a particular stage following completion of the example fabrication sequence described in connection with FIG. 1.

The cross-sectional view 211 may include the same or similar elements as the example cross-sectional view 100 as referenced in FIG. 1. For example, the working surface 201 is analogous or similar to working surface 101. First nitride material 205 is analogous or similar to first nitride material 105, second nitride material 208 is analogous or similar to second nitride material 108, and openings 232 is analogous or similar to openings 132.

An etch process (e.g., a first wet etch process or dry etch process) may be utilized to etch into (e.g., through) the hard mask material 207, the second nitride material 208, the second silicate material 206, the first nitride material 205, and/or the first silicate material 203 to form an opening within the previously listed materials (as is illustrated already as opening 232-1 between the plurality 209-1, 209-2, . . . , 209-N (hereinafter referred to collectively as plurality of pillars 209). Performance of the etch process may allow for a formation of an opening (within which a column of electrode material can be deposited) that extends from the upper surface of the hard mask material 207 to the surface 210 of the working surface 201.

The plurality of pillars 209 may be formed using a pattern of materials. The plurality of pillars 209 may be formed using a pattern of materials. The plurality of pillars 209 may, in a number of examples, be formed by patterning (e.g., depositing) a first silicate material 203, a first nitride material 205, a second silicate material 206, a second nitride material 208, and a hard mask material 207. A support structure formed as such may enable a stack of the first and the second silicate materials 203, 206 to be maintained in a more static configuration relative to each other and the underlying working surface 201 than provided by the first and the second silicate materials 203, 206 themselves.

In at least one example, the width or diameter of respective openings 232-1, 232-2 (hereinafter referred to collectively as openings 232) between the plurality of pillars 209 may be within a range of approximately 100-600 Angstroms (or 10 to 60 nm) and the height of the openings 232 may be within a range of approximately 8,000-15,000 Angstroms (800-1,500 nm) and may result in an aspect ratio (AR) of the height to width being in a range of approximately 25:1 to approximately 50:1. For clarity in the example fabrication sequence, the figures show a first opening 232-1 and a second opening 232-2 but examples are not limited to two openings and may include various numbers of openings.

The resultant openings 232 may have a height 222 in a range of from approximately 8,000 Angstroms (or 800 nm) to approximately 15,000 Angstroms (or 1,500 nm). Each of the materials may contribute a particular height to the overall height 222 of the structure. As is illustrated in FIG. 2, the first silicate material 203 can have a height 224-1, the first nitride material 205 can have a height 224-2, the second silicate material 206 can have a height 224-3, the second nitride material 208 can have a height 224-4, and the hard mask material 207 can have a height 224-5 that, when added together, results in the overall height 222.

In this example, the first silicate material (103 in FIG. 1) and the second silicate material (106 in FIG. 1) have been etched and recessed from the plurality of pillars 209. The first and second silicate materials may be removed with (via application of) a solvent that is selective for removing (e.g., dissolving) the first and second silicate materials from plurality of pillars 209 while not removing (e.g., leaving) other materials such that the nitride lattice materials that remain on the plurality of pillars 209. Such a selective solvent may be selected from water ($H_2O$), methanol ($CH_3OH$), ethanol ($C_2H_5OH$), isomers of propanol ($C_3H_7OH$) such as n-propanol and isopropanol, n-butanol ($C_4H_9OH$), among other possible alcohols, and sulfuric acid ($H_2SO_4$), Hydrofluoric acid (HF), Phosphoric Acid ($H_3PO_4$), Hydrochloric Acid (HCl), Ammonium Hydroxide ($NH_4OH$), and combinations thereof, among other possibilities.

A capacitor material, e.g., an electrode material 223, may be formed (e.g., deposited) within the openings 232. The electrode material 223, e.g., a bottom electrode, may be formed (e.g., deposited) from the working surface 201 to a height 222 of the openings 232 at the upper surface of the plurality of pillars 209 through a conformal deposition process such as chemical vapor deposition (CVD). For example, the inner surfaces of the openings 232 may be covered by the electrode material 223.

The electrode material 223 may be formed from a nitride compound material selected for conductive properties. For example, one or more conductive nitrides may be selected from gallium nitride (GaN), tantalum nitride (TaN, $Ta_2N$), titanium nitride (TiN, $Ti_2N$), aluminum doped titanium nitride (TiAlN), silicon doped titanium nitride (TiSiN), boron doped titanium nitride (TiBN), and tungsten nitride (WN, $W_2N$, $WN_2$), among other possibilities. The electrode material 223 may be formed to various widths (e.g., thicknesses) as suited to a particular design rule for the formation of an operable capacitor for a semiconductor device.

In one example, in order to increase the capacitance of a cell of the memory device, a surface area of the electrode material 223, formed into a column may be increased by increasing the height of the electrode material 223 within the openings 232. However, due to possible gap margins and smaller pitch, increasing the height of the electrode material 223 may increase the risk of bulges on the electrode material 223 which may reduce the opening available for capacitor materials and poor electrical conduction. The bulge 214 may be formed on an upper portion of the electrode material 223. The upper portion of the electrode material 223 may constitute fifty percent (50%) of the electrode material 223.

The bulge 214 may be a wider protruding feature formed on the electrode material 223. The bulge 214 may also protrude into the plurality of pillars 209, reducing the space for the capacitor materials. As an example, the bulge 214 may begin at an upper surface of the first nitride material 205. In order to mitigate this issue, a method for etching the bulges using oxygen is described further below. The etch may result in a straighter electrode material 223 and increased space within the openings 232 to deposit capacitor materials.

Figure 3:
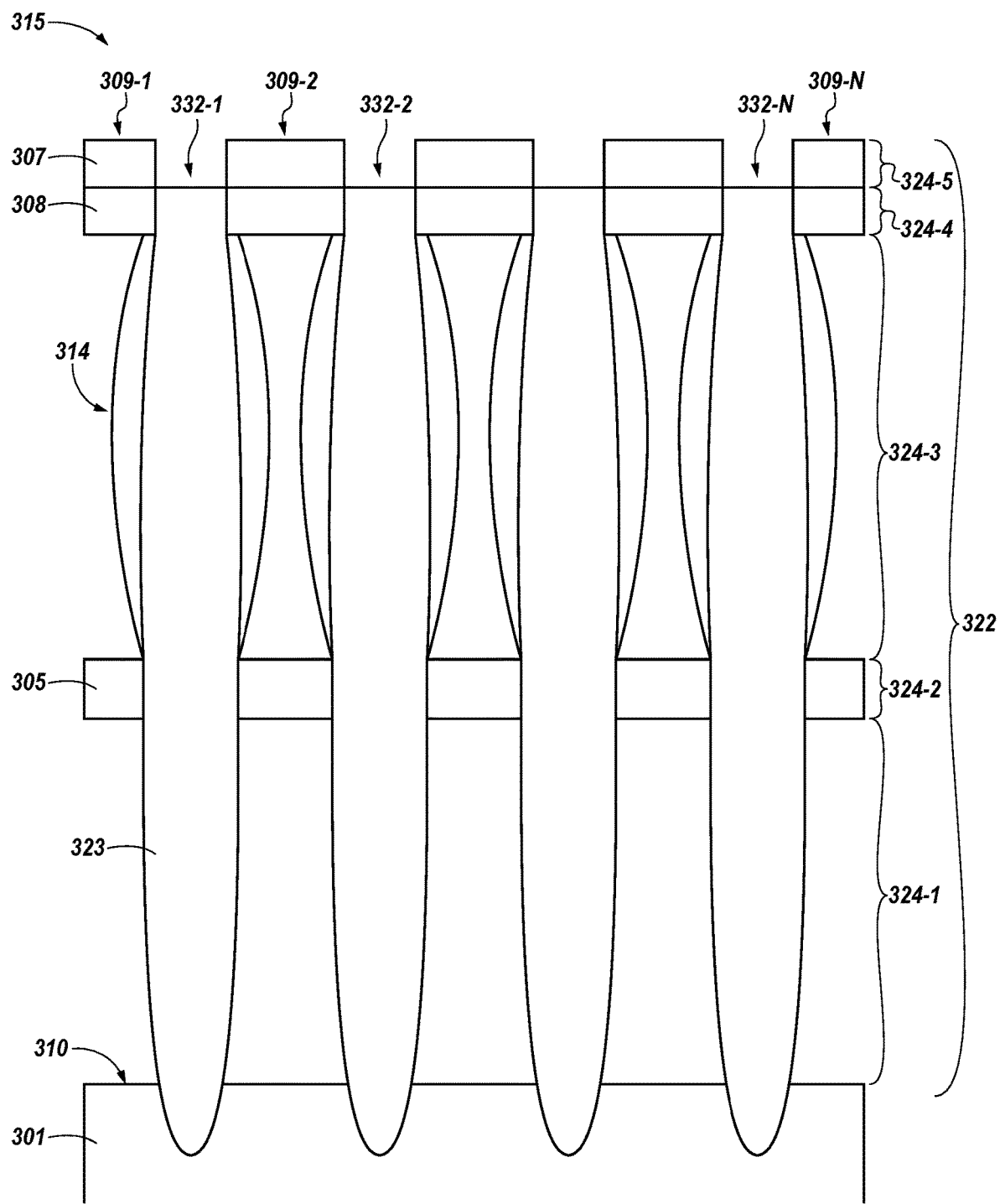

FIG. 3 illustrates a cross-sectional view 315 of a portion of semiconductor structure of a memory device in association with a semiconductor fabrication sequence for trimming a semiconductor structure using oxygen in accordance with a number of examples of the present disclosure. FIG. 3 illustrates the example semiconductor structure following completion of the example fabrication sequence described in connection with FIG. 2.

The cross-sectional view 315 can include the same or similar elements as the example cross-sectional views 100 and 211 as referenced in FIGS. 1 and 2, respectively. For example, the working surface 301 is analogous or similar to working surface 101 and 201 of FIGS. 1 and 2, respectively. The first nitride material 305 is analogous or similar to first nitride material 105 and 205 of FIGS. 1 and 2, respectively. The second nitride material 308 is analogous or similar to second nitride material 108 and 208 of FIGS. 1 and 2, respectively. The electrode material 323 is analogous or similar to second nitride material 223. The bulge 314 is analogous or similar to bulge 214. The hard mask material 307 is analogous or similar to hard mask material 107 and 207 of FIGS. 1 and 2, respectively.

In order to selectively trim the electrode material 323 using oxygen, the upper portion requiring the trim is exposed to oxygen. The oxidization may be non-conformal and target only the upper portion of the electrode material 323. The upper portion of the electrode material 323 may be targeted because the bulge 314 is located in the upper portion. In one example, the electrode material 323 is oxidized using a high temperature. In this example, a high temperature may refer to a range between 225° C. and 550° C. The electrode material 323 may be exposed to the high temperature between 2-300 seconds. The quick exposure of the electrode material 323 to a high temperature may cause the electrode material 323 to oxidize. The oxidation may be performed under water or hydrogen peroxide ($H_2O_2$), among other possibilities.

In another example, the electrode material 323 may be oxidized using high pressure. In this example, high pressure may refer to pressure greater than 80 torr. A reactive gas, such as ozone may be used in the place of oxygen in a high pressure oxidization trim. The ozone may also be used in a low pressure oxidization trim. The ozone may be flown in inert gas. The reactive gas is flown over the electrode material 323 under pressure which may cause the electrode material 323 to oxidize. The high pressure oxidization trim may be performed under water.

In another example, the electrode material 323 may be oxidized using a plasma based chemistry. The plasma based chemistry may be performed using a reactive gas. The plasma based chemistry may be performed using a mixture of nitrogen, argon or a combination of nitrogen and argon. The plasma based chemistry may be performed using a vapor etch. The electrode material 323 may be exposed to the plasma based chemistry for a range of 1-10 seconds.

Figure 4:
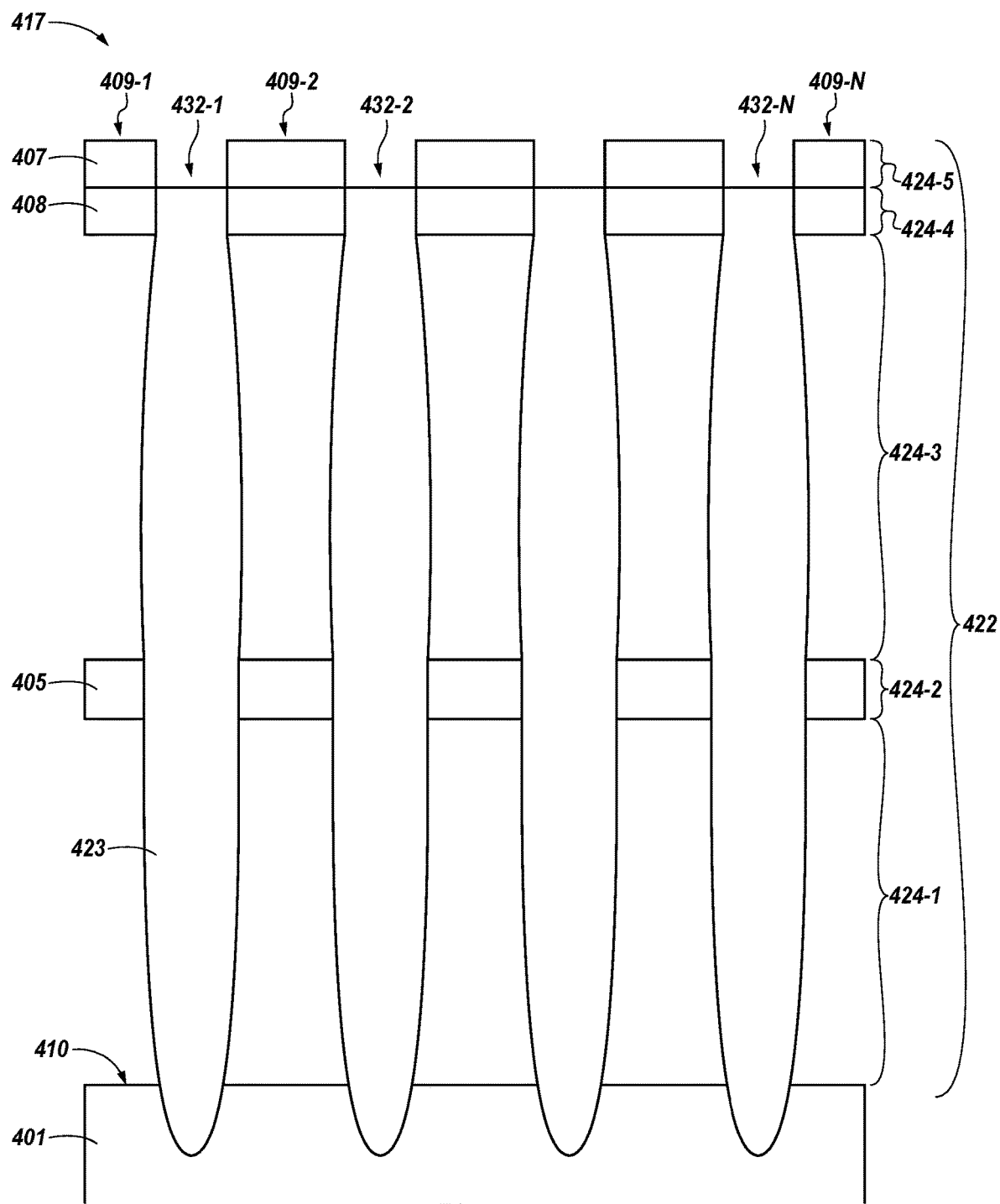

FIG. 4 illustrates a cross-sectional view 417 of a portion of semiconductor structure of a memory device in association with a semiconductor fabrication sequence for trimming a semiconductor structure using oxygen in accordance with a number of examples of the present disclosure. FIG. 4 illustrates the example semiconductor structure following completion of the example fabrication sequence described in connection with FIG. 3.

The cross-sectional view 417 can include the same or similar elements as the example cross-sectional views 100, 211, and 315 as referenced in FIGS. 1, 2, and 3 respectively. For example, the working surface 401 is analogous or similar to working surface 101, 201, and 301 of FIGS. 1, 2, and 3 respectively. The first nitride material 405 is analogous or similar to first nitride material 105, 205, and 305 of FIGS. 1, 2, and 3 respectively. The second nitride material 408 is analogous or similar to second nitride material 108, 208, and 308 of FIGS. 1, 2, and 3 respectively. The electrode material 423 is analogous or similar to electrode material 223, and 323 of FIGS. 2, and 3 respectively. The hard mask material 407 is analogous or similar to second nitride material 107, 207, and 307 of FIGS. 1, 2, and 3 respectively.

After exposing the upper portion of the electrode material 423 to oxidative reactions, the upper portion of the electrode material 423 may be oxidized and converted into a titanium oxide (TiO) or titanium oxynitride (TiOxN) byproduct. The electrode material 423 may be oxidized by exposing the electrode material to oxygen in accordance with the accordance with a number of examples in the present disclosure. The lattice structures (405 and 408) of the plurality of pillars may not be affected by the oxidation trim.

The byproduct may be etched by either a wet etch or dry etch. The wet etch may be carried out using a dilute hydrofluoric (HF) acid combination. The HF may be diluted with water at a ratio between 10 to 1000 parts water to 1 part hydrofluoric acid. The etch materials, particularly the HF may selectively target the byproduct, not the electrode material 423. The byproduct may also be etched by a vapor etch. The vapor etch may be carried out by using halide compounds to form volatile metal-halide materials with the electrode material 423. The vapor etch may be carried out using hydrogen gas.

The byproduct may also be etched using supercritical drying. Supercritical drying is a controlled process for removal of the liquid. Supercritical drying may be applied using a particular compound at an appropriate temperature and/or pressure to result in the liquid to gas transition not crossing a phase boundary. Instead, the liquid and the gas pass through a supercritical region where the densities of the liquid phase and the gas phase become substantially equal at the critical point used for drying. Examples of usable supercritical compounds may include carbon dioxide ($CO_2$), nitrous oxide ($N_2O$), and water ($H_2O$), among other possible supercritical compounds.

The etching away of the byproduct may remove the bulge on the electrode material 423, resulting in a straighter electrode material 423 and increased space within the openings 432. Each side of the upper portion of the electrode material 423 is reduced by a range between 5-20 Angstroms due to the oxidative trim. The straighter electrode material 423 may be able to avoid under etch, pinching, and poor resistivity while still maintaining a high aspect ratio.

Figure 5:
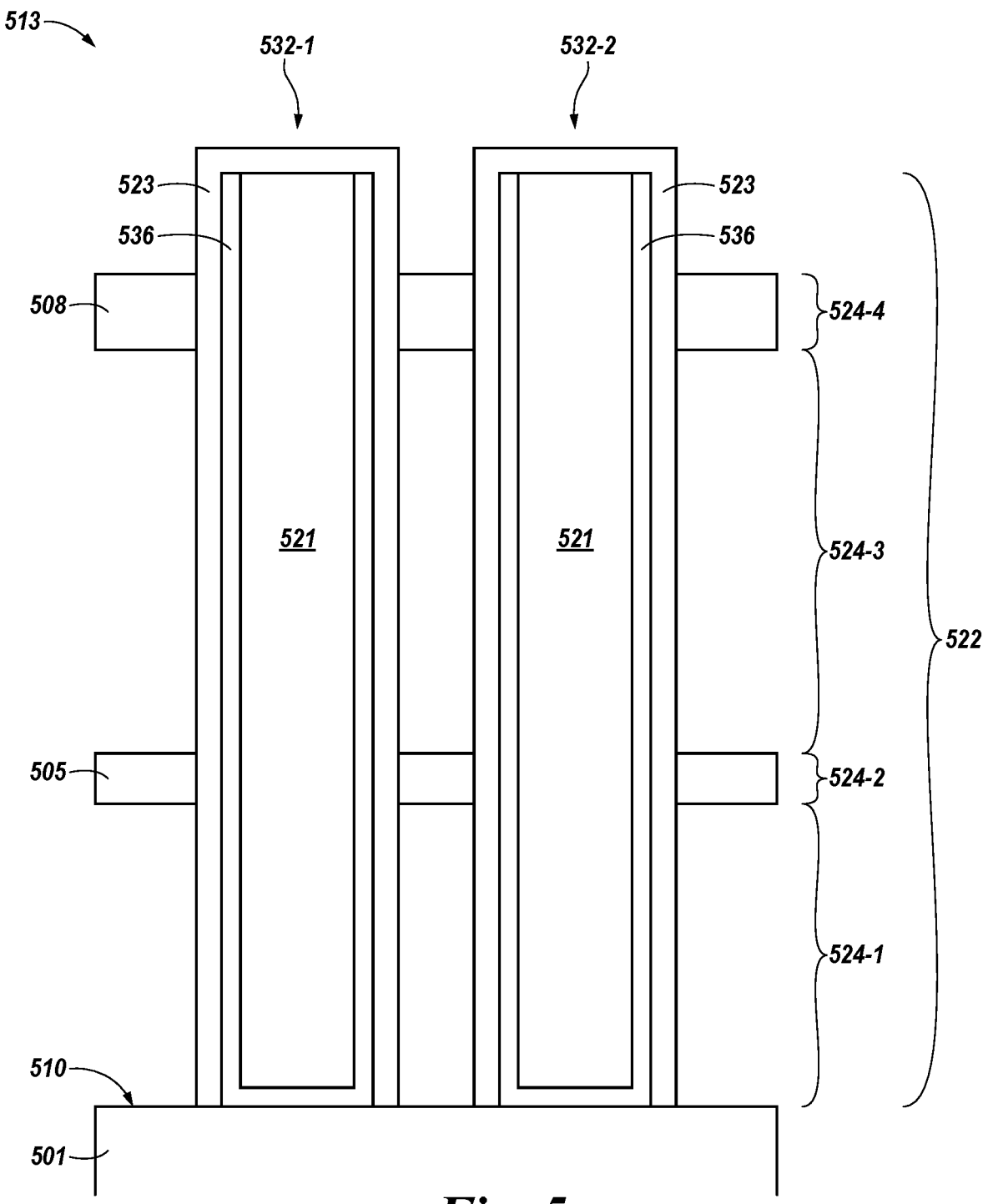

FIG. 5 illustrate cross-sectional views 513 of a portion of a semiconductor structure of a memory device in association with a semiconductor fabrication sequence for trimming a semiconductor structure using oxygen in accordance with a number of examples of the present disclosure. FIG. 5 illustrates the example semiconductor structure at the particular stage following completion of the example fabrication sequence described in connection with FIG. 4.

The cross-sectional view 513 can include the same or similar elements as the example cross-sectional views 100, 211, 315, and 417 as referenced in FIGS. 1, 2, 3, and 4 respectively. For example, the working surface 501 is analogous or similar to working surface 101, 201, 301, and 401 of FIGS. 1, 2, 3, and 4 respectively. The first nitride material 505 is analogous or similar to first nitride material 105, 205, 305, and 405 of FIGS. 1, 2, 3, and 4 respectively. The second nitride material 508 is analogous or similar to second nitride material 108, 208, 308, and 408 of FIGS. 1, 2, 3, and 4 respectively. The electrode material 523 is analogous or similar to electrode material 223, 323 and 423 of FIGS. 2, 3, and 4, respectively.

As shown, an electrode material 523 may be formed (e.g., deposited) on the surface 510 of the working surface 501 and on the sidewalls of the openings 532. As is illustrated in FIG. 5, a capacitor material 521 is shown as having been formed (e.g., deposited) to fill the openings 532 from the working surface 501 to a height 522 of the openings 532 at the upper surface of the plurality of pillars. An opening 532 may extend from the working surface 501 to the height 522 of the openings 532 at the upper surface of the plurality of pillars.

In a number of examples, the capacitor material 521 may be deposited to fill the openings 532 to an upper surface of the electrode material 523. The electrode material 523 and the capacitor material 521 may be formed from conductive materials and to various widths (e.g., thicknesses) as suited to a particular design rule for the formation of an operable capacitor for a semiconductor device.

The electrode material 523 may be formed (e.g., deposited) on upper surfaces of remaining portions of the capacitor material 521, such that the capacitor material 521 is covered on all surfaces with the electrode material 523. That is, a height 522 of the capacitor material 521 is covered by the electrode material 523. As an example, the height 522 of the capacitor material 521 spans the height 524-1 of the removed first silicate material, the height 524-2 of the first nitride material 505, the height 524-3 of the removed second silicate material, and the height 524-4 of the second nitride material 508, that, when added together, results in the overall height 522.

In a number of examples, the capacitor material 521 may be deposited to fill the openings 532 to an upper surface of the electrode material 523. The electrode material 523 and the capacitor material 521 may be formed from conductive materials and to various widths (e.g., thicknesses) as suited to a particular design rule for the formation of an operable capacitor for a semiconductor device.

As shown, a dielectric material 536 has been formed (e.g., deposited) on an outer surface of the electrode material 523. The dielectric material 536 may, in a number of examples, be formed from a surface 510 of the working surface 501 to cover the outer surface, including an upper surface, of the electrode material 523.

Figure 6:
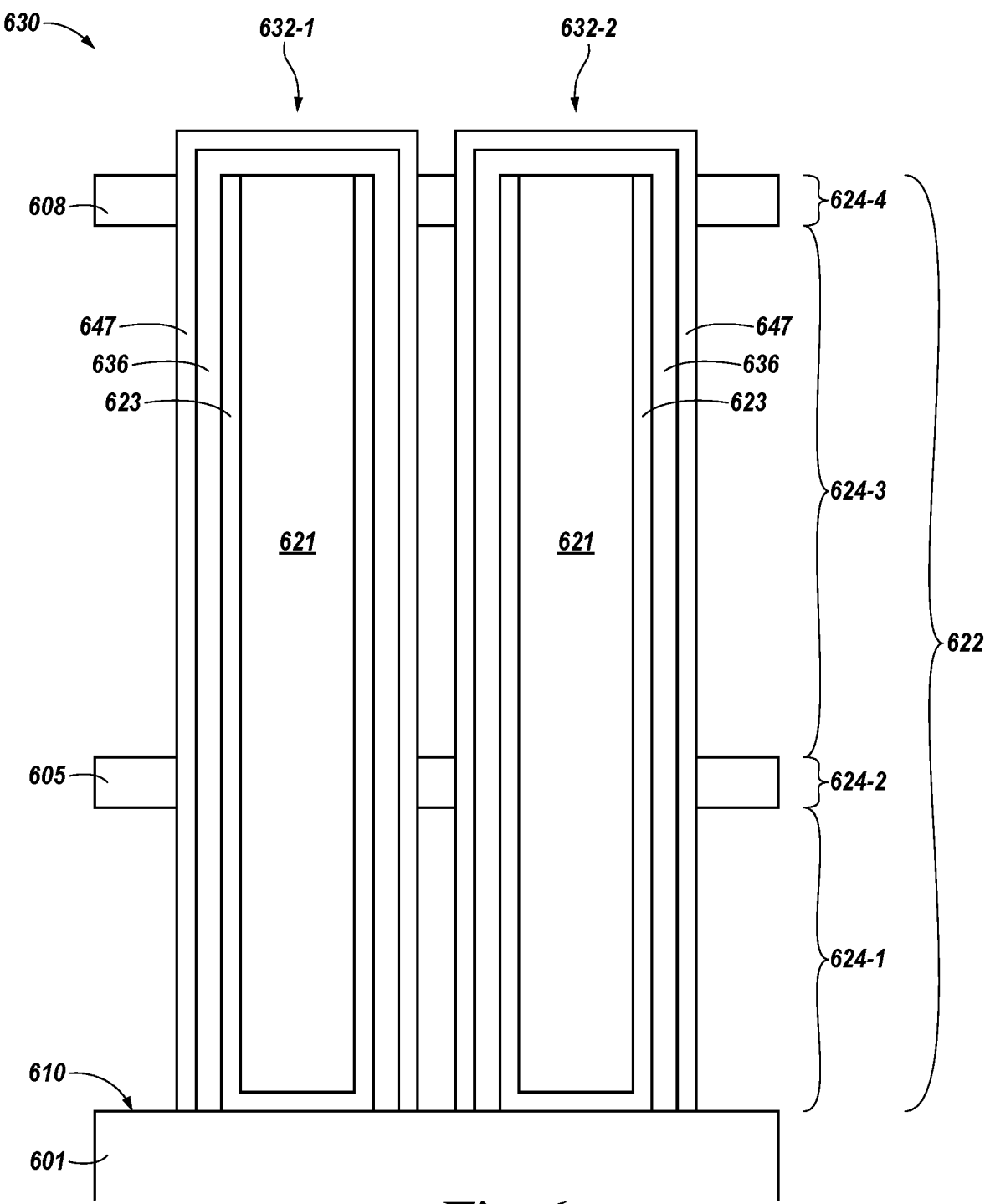

FIG. 6 illustrates a cross-sectional view 630 of a portion of an example semiconductor structure of a memory device in association with a semiconductor fabrication sequence for trimming a semiconductor structure using oxygen in accordance with a number of examples of the present disclosure. FIG. 6 illustrates the example semiconductor structure following completion of the example fabrication sequence described in connection with FIG. 6.

The cross-sectional view 630 can include the same or similar elements as the example cross-sectional views 100, 211, 315, 417, and 513 as referenced in FIGS. 1, 2, 3, 4, and 5 respectively. For example, the working surface 601 is analogous or similar to working surface 101, 201, 301, 401, and 501 of FIGS. 1, 2, 3, 4, and 5 respectively. The first nitride material 605 is analogous or similar to first nitride material 105, 205, 305, 405, and 505 of FIGS. 1, 2, 3, 4, and 5 respectively. The second nitride material 608 is analogous or similar to second nitride material 108, 208, 308, 408, and 508 of FIGS. 1, 2, 3, 4, and 5 respectively. The electrode material 623 is analogous or similar to electrode material 223, 323, 423, and 523 of FIGS. 2, 3, 4, and 5 respectively.

Using the techniques and method embodiments described herein has allowed maintaining a height (H) 622 to achieve greater surface area to the storage node structure, e.g., capacitor cell, permitting an increase in the capacitance of the one (1) to five (5) percent (1-5%) according to a particular design rule. As shown, the dielectric material 636 has been formed (e.g., deposited) on an outer surface of the electrode material 623. The dielectric material 636 may, in a number of examples, be formed from a surface of the working surface 601 to cover the outer surface, including an upper surface, of the electrode material 623. A capacitor may be subsequently formed, at least in part, by formation (e.g., deposition) of a top electrode material 647 on an outer surface of the dielectric material 636.

As is illustrated in FIG. 6, a height 622 of the semiconductor support structure can include a height 624-2 and 624-4 of the first nitride material 605 and the second nitride material 608 along with heights 624-1, and 624-3 of the removed first silicate material, and the second silicate material.

A height 622 of the capacitor may be higher than the height of the original opening (H 622) due to the maintained height of the second nitride material 608 and resultantly the electrode material 623, the added height of the dielectric material 636, and the top electrode material 647, being formed over the electrode material 623. The dielectric material 636 and the top electrode material 647 may be formed from various respective dielectric materials, conductive materials, and resistive materials and to various width (e.g., thickness) usable in association with formation of an operable capacitor material 621 for a semiconductor device.

The support structure is formed from the first nitride material 605 and the second nitride material 608, in addition to the underlying working surface 601. The support structure may provide support to the electrode material 623 after the removal of the first and second silicate materials has left voids in the semiconductor structure and even after such voids may have been at least partially filled by a buffer material. The support structure formed from the first and second nitride materials 605, 608 is shown for ease of illustration in what can be a 3D-cross sectional view to be supporting behind the capacitor material 621 and the right side of the electrode material 623. However, the support structure formed from the first and second nitride materials 605, 608 also may be on the opposite sides, or may be attached at four position or even surround, the electrode material 623. In a number of examples, the dielectric material 636 and/or the top electrode material 647 may surround the electrode material 623 except at defined positions where the first and second nitride materials 605, 608 of the support structures are attached to the electrode material 623.

Formation of the capacitors and a capacitor support structure as just described may enable each of the capacitors to be maintained in a static configuration (e.g., relative to each other and the underlying material). For example, the capacitor support structure may reduce (e.g., prevent) a possibility of a capacitor bending and/or twisting during fabrication or use. By including a sacrificial storage node, as described herein, the width for openings 632 may be widened, increasing the space for the capacitor to be filled. The capacitor may be filled into the openings 632, leaving space for another capacitor material to be filled without the two capacitor materials touching. For example, the widening of the openings 632.

Formation of the capacitors and capacitor support structure as just described may be utilized in fabrication of a memory device that includes at least one memory cell. Such a memory cell may include at least one such capacitor, as a data storage element, that is supported by the capacitor support structure. The memory cell also may include at least one access device (e.g., transistor) (not shown) that is, or may be, coupled to the at least one capacitor.

Figure 7:
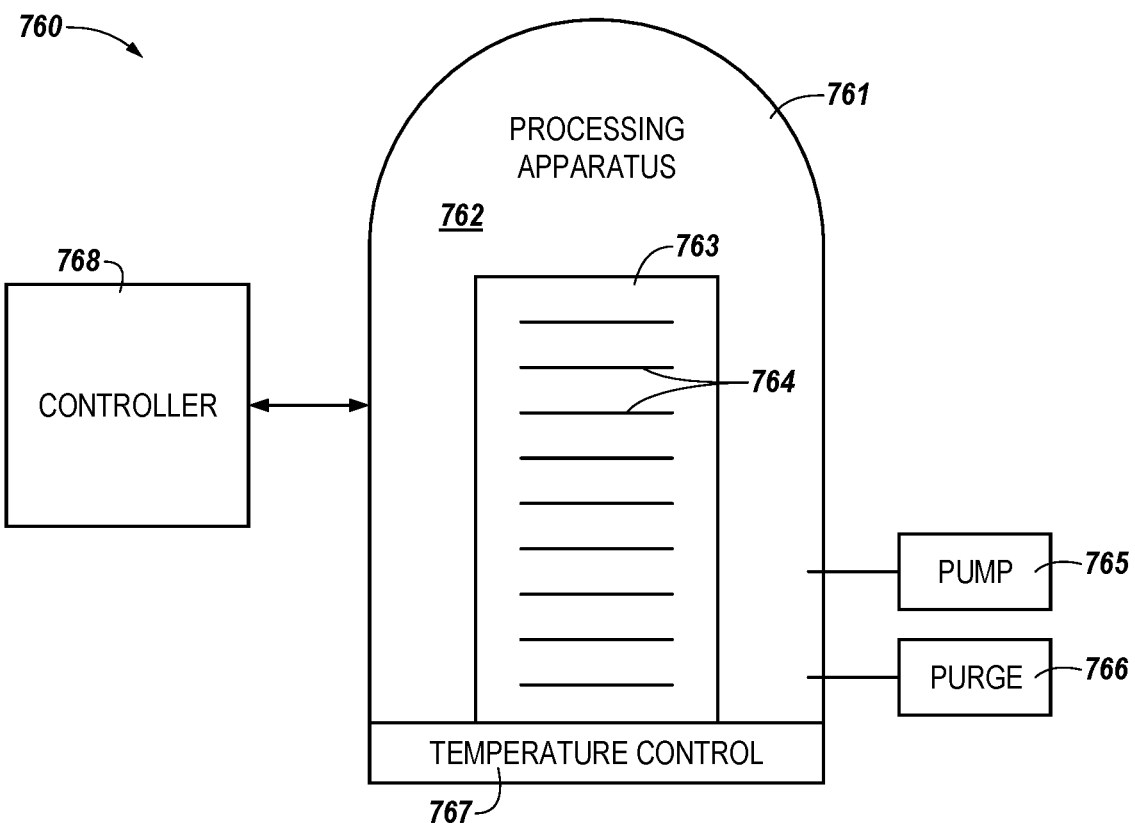
FIG. 7 is a functional block diagram of a system for implementation of an example semiconductor fabrication process in accordance with a number of embodiments of the present disclosure.

FIG. 7 is a functional block diagram of a system 760 for implementation of an example semiconductor fabrication process in accordance with a number of embodiments of the present disclosure. The system 760 can include a processing apparatus 761. The processing apparatus 761 can be configured to enable trimming a semiconductor structure using oxygen.

The processing apparatus 761 can include a semiconductor processing chamber 762 to enclose components configured to trim a semiconductor structure using oxygen. The chamber 762 can further enclose a carrier 763 to hold a batch of semiconductor wafers 764 (e.g., the working surface 101). The processing apparatus 761 can include and/or be associated with tools including, for example, a pump 765 unit and a purge 766 unit configured to introduce and remove reducing agents. The processing apparatus 761 can further include a temperature control 767 unit configured to maintain the chamber 762 at appropriate temperatures as described herein.

The system 760 can further include a controller 768. The controller 768 can include, or be associated with, circuitry and/or programming for implementation of, for instance, trimming a semiconductor structure using oxygen. Adjustment of such deposition and purging operations by the controller 768 can control the thickness of the materials described herein (such as the first silicate material, the first nitride material, the first silicate material, and the second nitride material).

The controller 768 can, in a number of embodiments, be configured to use hardware as control circuitry. Such control circuitry may, for example, be an application specific integrated circuit (ASIC) with logic to control fabrication steps, via associated deposition and purge processes, for trimming a semiconductor structure using oxygen.

Figure 8:
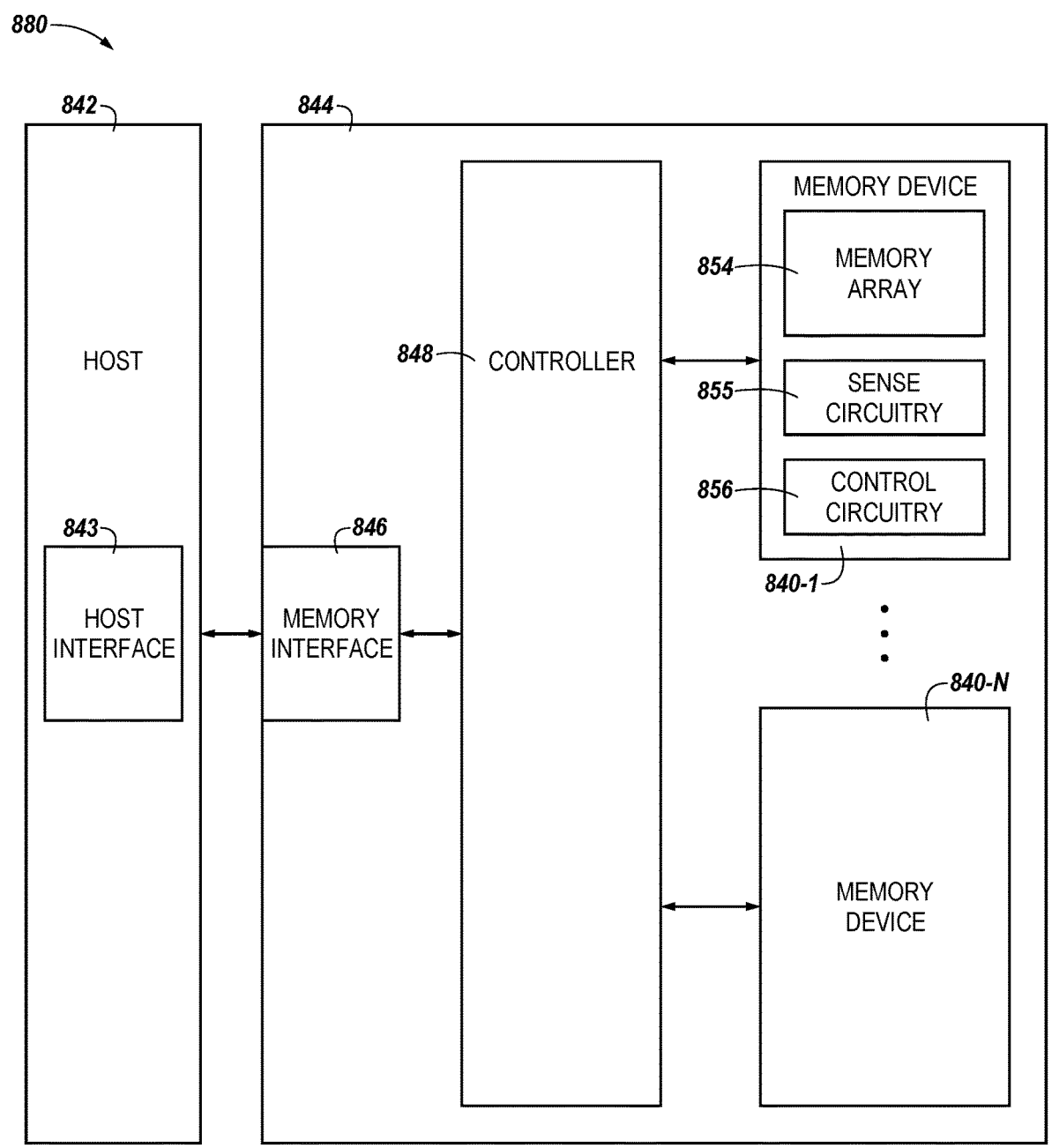
FIG. 8 illustrates a functional block diagram of an example computing system including a semiconductor structure of a memory system in accordance with a number of examples of the present disclosure.

FIG. 8 is a functional block diagram of an example computing system including a semiconductor structure of a memory system in accordance with a number of examples of the present disclosure. Memory system 844 may be, for example, a solid-state drive (SSD).

In the example illustrated in FIGS. 1-4, memory system 844 includes a memory interface 846, a number of memory devices 840-1, . . . 840-N, and a controller 848 selectably coupled to the memory interface 846 and memory devices 840-1, . . . 840-N. Memory interface 846 may be used to communicate information between memory system 844 and another device, such as a host 842. Host 842 may include a processor (not shown). As used herein, "a processor" may be a number of processors, such as a parallel processing system, a number of coprocessors, etc. Example hosts may include, or by implemented in, laptop computers, personal computers, digital cameras, digital recording devices and playback devices, mobile telephones, PDAs, memory card readers, interface hubs, and the like. Such a host may be associated with fabrication operations performed on semiconductor devices and/or SSDs using, for example, a processing.

In a number of examples, host 842 may be associated with (e.g., include or be coupled to) a host interface 843. The host interface 843 may enable input of scaled preferences (e.g., in numerically and/or structurally defined gradients) to define, for example, critical dimensions (CDs) of a final structure or intermediary structures of a memory device (e.g., as shown at 840) and/or an array of memory cells (e.g., as shown at 854) formed thereon to be implemented by the processing apparatus. The scaled preferences may be provided to the host interface 843 via input of a number of preferences stored by the host 842, input of preferences from another storage system (not shown), and/or input of preferences by a user (e.g., a human operator).

Memory interface 846 may be in the form of a standardized physical interface. For example, when memory system 844 is used for information (e.g., data) storage in computing system 880, memory interface 846 may be a serial advanced technology attachment (SATA) interface, a peripheral component interconnect express (PCIe) interface, or a universal serial bus (USB) interface, among other physical connectors and/or interfaces. In general, however, memory interface may provide an interface for passing control, address, information, scaled preferences, and/or other signals between the controller 848 of memory system 844 and a host 842 (e.g., via host interface 843).

Controller 848 may include, for example, firmware and/or control circuitry (e.g., hardware). Controller 848 may be operably coupled to and/or included on the same physical device (e.g., a die) as one or more of the memory devices 840-1, . . . 840-N. For example, controller 848 may be, or may include, an ASIC as hardware operably coupled to circuitry (e.g., a printed circuit board) including memory interface 846 and memory devices 840-1, . . . 840-N. Alternatively, controller 848 may be included on a separate physical device that is communicatively coupled to the physical device (e.g., the die) that includes one or more of the memory devices 840-1, . . . 840-N.

Controller 848 may communicate with memory devices 840-1, . . . 840-N to direct operations to sense (e.g., read), program (e.g., write), and/or erase information, among other functions and/or operations for management of memory cells. Controller 848 may have circuitry that may include a number of integrated circuits and/or discrete components. In a number of examples, the circuitry in controller 848 may include control circuitry for controlling access across memory devices 840-1, . . . 840-N and/or circuitry for providing a translation layer between host 842 and memory system 844.

Memory devices 840-1, . . . 840-N may include, for example, a number of memory arrays 854 (e.g., arrays of volatile and/or non-volatile memory cells). For instance, memory devices 840-1, . . . 840-N may include arrays of memory cells, such as a portion of an example memory device 890 structured to form structures formed according to embodiments described in FIGS. 1-4, described in connection with FIG. 8. As will be appreciated, the memory cells in the memory arrays 854 of memory devices 840-1, . . . 840-N may be in a RAM architecture (e.g., DRAM, SRAM, SDRAM, FeRAM, MRAM, ReRAM, etc.), a flash architecture (e.g., NAND, NOR, etc.), a three-dimensional (3D) RAM and/or flash memory cell architecture, or some other memory array architecture including pillars and adjacent trenches.

Memory devices 840 may be formed on the same die. A memory device (e.g., memory device 840-1) may include one or more arrays 854 of memory cells formed on the die. A memory device may include sense circuitry 855 and control circuitry 856 associated with one or more arrays 854 formed on the die, or portions thereof. The sense circuitry 855 may be utilized to determine (sense) a particular data value (e.g., 0 or 1) that is stored at a particular memory cell in a row of an array 854. The control circuitry 856 may be utilized to direct the sense circuitry 855 to sense particular data values, in addition to directing storage, erasure, etc., of data values in response to a command from host 842 and/or host interface 843. The command may be sent directly to the control circuitry 856 via the memory interface 846 or to the control circuitry 856 via the controller 848.

The example illustrated in FIG. 8 may include additional circuitry that is not illustrated so as not to obscure examples of the present disclosure. For example, memory devices 840 may include address circuitry to latch address signals provided over I/O connectors through I/O circuitry. Address signals may be received and decoded by a row decoder and a column decoder to access a memory array 854. It will be appreciated that the number of address input connectors may depend on the density and/or architecture of memory devices 840 and/or memory arrays 854.

Figure 9:
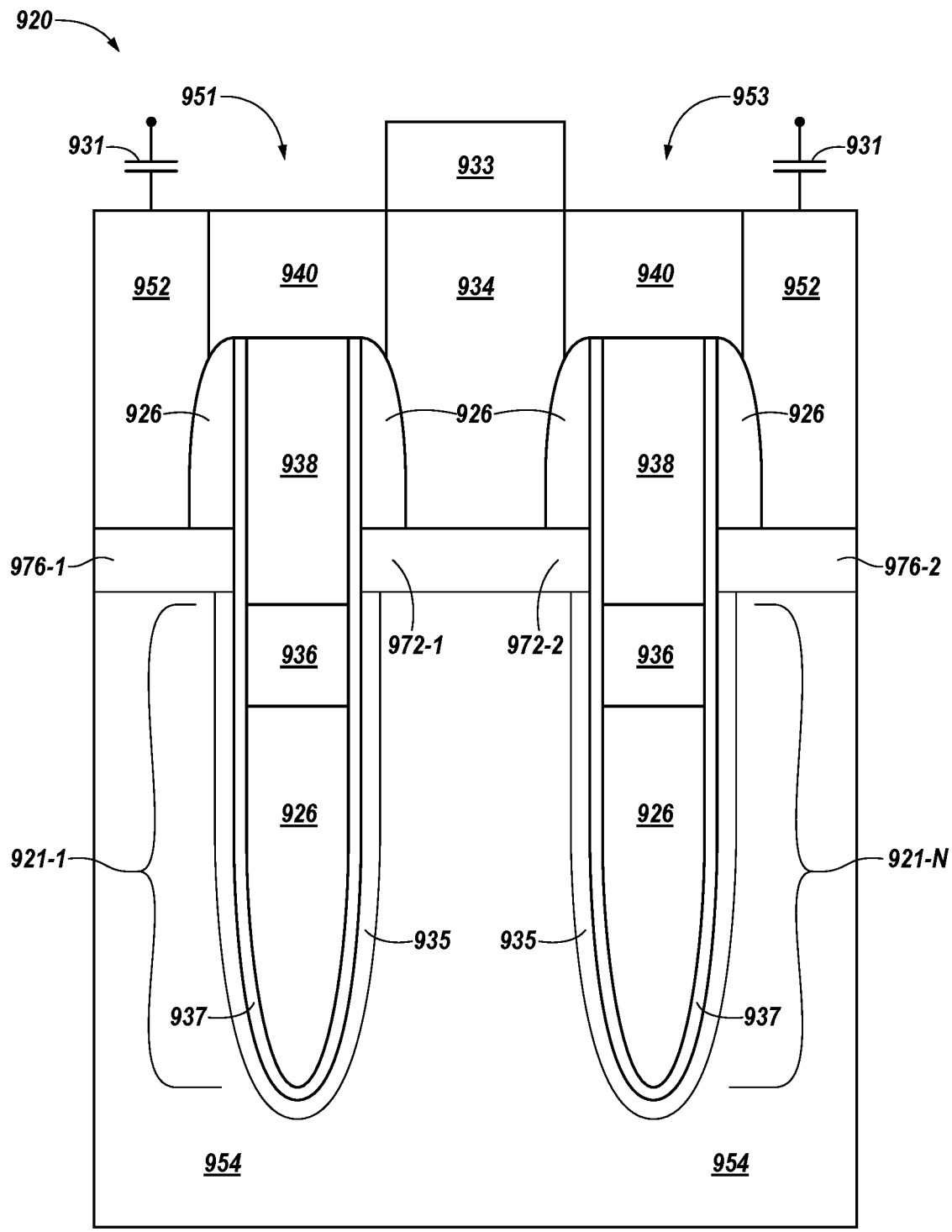
FIG. 9 illustrates a cross-sectional view of an access device which can be coupled to a storage node having an electrode in accordance with a number of embodiments of the present disclosure.

FIG. 9 illustrates a cross-sectional view of an apparatus 920 showing a pair of neighboring memory cells sharing a source/drain region, e.g., 971-1 and 972-2, and a sense line contact 934 connecting to a passing sense line 952. The pair of neighboring memory cells include access devices 953 coupled to storage node contact 952 and storage nodes 931 in accordance with a number of embodiments of the present disclosure. FIG. 9 illustrates gates 951-1, . . . 951-N (individually or collectively referred to as gate 951) during a fabrication process. The gate 951 can also be referred to as a gate electrode. The gate 951 may be a gate to a recessed access device, e.g., a buried recessed access device (BRAD). In the example shown, the gate 951 may include a first portion 926 including a metal, e.g., titanium nitride (TiN), and a second portion 986 including a doped polysilicon to form a hybrid metal gate (HMG) 951. The gate 951 may be separated from a channel 935, separating a first source/drain region 976-1 and 976-2 (collectively referred to as first source/drain region 976) and a second source/drain region 972-1 and 972-2 (collectively referred to as second source/drain region 972) by a gate dielectric 937. In the example of FIG. 1, two neighboring access devices 951 and 953 are shown sharing a second source/drain region 972 at a junction. The neighboring access devices 951 and 953 may be formed on a working surface of a semiconductor material on a substrate material 954.

In the example of FIG. 9, a storage node (shown schematically for ease of illustration) is connected to a storage node contact 952 formed in accordance with the techniques described herein. The storage node contact 952 may be connected to an active area, e.g., a first source/drain region 976 of an access device 953. An insulation material 940 (e.g., a dielectric material) can be formed on the spacer material 926 and the gate mask material 938, and in contact with the metallic material 934. In at least one embodiment, a first portion 928 of the metallic material 934 can be formed in contact with the spacer material 926, the source/drain regions 972 and 976, and the junction. The insulation material 940 can be formed on the spacer material 926 and the gate mask material 938, and in contact with the metallic material 934.

In the above detailed description of the present disclosure, reference is made to the accompanying drawings that form a part hereof, and in which is shown by way of illustration how one or more examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the present disclosure.

It is to be understood that the terminology used herein is for the purpose of describing particular examples only and is not intended to be limiting. As used herein, the singular forms "a", "an", and "the" include singular and plural referents, unless the context clearly dictates otherwise, as do "a number of", "at least one", and "one or more" (e.g., a number of memory arrays may refer to one or more memory arrays), whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically and, unless stated otherwise, can include a wireless connection for access to and/or for movement (transmission) of instructions (e.g., control signals, address signals, etc.) and data, as appropriate to the context.

While example examples including various combinations and configurations of semiconductor materials, underlying materials, structural materials, dielectric materials, capacitor materials, working surface materials, silicate materials, nitride materials, buffer materials, etch chemistries, etch processes, solvents, memory devices, memory cells, sidewalls of openings and/or trenches, among other materials and/or components related to trimming a semiconductor structure have been illustrated and described herein, examples of the present disclosure are not limited to those combinations explicitly recited herein. Other combinations and configurations of the semiconductor materials, underlying materials, structural materials, dielectric materials, capacitor materials, substrate materials, silicate materials, nitride materials, buffer materials, etch chemistries, etch processes, solvents, memory devices, memory cells, sidewalls of openings and/or trenches related to trimming a semiconductor structure using oxygen than those disclosed herein are expressly included within the scope of this disclosure.

Although specific examples have been illustrated and described herein, those of ordinary skill in the art will appreciate that an arrangement calculated to achieve the same results may be substituted for the specific examples shown. This disclosure is intended to cover adaptations or variations of one or more examples of the present disclosure. It is to be understood that the above description has been made in an illustrative fashion, and not a restrictive one. Combination of the above examples, and other examples not specifically described herein will be apparent to those of skill in the art upon reviewing the above description. The scope of the one or more examples of the present disclosure includes other applications in which the above structures and processes are used. Therefore, the scope of one or more examples of the present disclosure should be determined with reference to the appended claims, along with the full range of equivalents to which such claims are entitled.

In the foregoing Detailed Description, some features are grouped together in an example for the purpose of streamlining the disclosure. This method of disclosure is not to be interpreted as reflecting an intention that the disclosed examples of the present disclosure have to use more features than are expressly recited in each claim. Rather, as the following claims reflect, inventive subject matter lies in less than all features of a disclosed example. Thus, the following claims are hereby incorporated into the Detailed Description, with each claim standing on its own as a separate example.

What is claimed is:

1. A method, comprising:
   forming a support structure for a semiconductor structure:
   a first silicate material on a working material;
   a first nitride material on the first silicate material;
   a second silicate material on the first nitride material; and
   a second nitride material on the second silicate material;
   forming an opening through the semiconductor structure;
   depositing an electrode material within the opening;
   removing portions of the support structure; and
   performing a controlled oxidative trim to an upper portion of the electrode material.

2. The method of claim 1, further comprising performing the controlled oxidative trim at a temperature range between 225° Celsius (C) and 450° C.

3. The method of claim 2, further comprising performing the controlled oxidative trim in a range between 2-300 seconds (s).

4. The method of claim 1, further comprising performing the controlled oxidative trim by exposing the semiconductor structure to an atmosphere with oxygen and a pressure greater than 80 torr.

5. The method of claim 4, further comprising performing the controlled oxidative trim under pressure using ozone.

6. The method of claim 1, further comprising performing the controlled oxidative trim by plasma-based chemistry.

7. The method of claim 4, further comprising performing the plasma-based chemistry for a range of time between 1 to 10 seconds.

8. The method of claim 4, further comprising converting the upper portion of the electrode material to one of titanium oxide (TiO) and titanium oxynitride (TiOxNy) during the controlled oxidative trim.

9. An apparatus, comprising:
   a high aspect ratio semiconductor structure having:
   a first silicate material on a working material;
   a first nitride material on the first silicate material;
   a second silicate on the first nitride material; and
   a second nitride material on the second silicate material;
   an opening formed through the semiconductor structure; and
   an electrode material formed within the opening and an upper portion of the electrode material is reduced using a controlled oxidative trim.

10. The apparatus of claim 9, wherein a side of the upper portion of the electrode material is reduced by a range between 5-20 Angstroms.

11. The apparatus of claim 9, wherein the upper portion of the electrode material constitutes fifty percent (50%) of the electrode material.

12. The apparatus of claim 9, wherein the electrode material is formed from one of a titanium nitride (TiN) material, a silicon doped titanium nitride (TiSiN) material, and an aluminum doped titanium nitride (TiAlN) material.

13. The apparatus of claim 9, wherein a wet etch is used to remove an oxidized portion of the electrode material using a wet etch.

14. The apparatus of claim 13, wherein the wet etch is formed from a diluted hydrofluoric acid mixture.

15. The apparatus of claim 13, wherein the wet etch has a dilution mixture of 10 to 1000 parts water to 1 part hydrofluoric acid.

16. The apparatus of claim 12, wherein a vapor etch is used to remove an oxidized portion of the electrode material.

17. The apparatus of claim 9, wherein a dry etch is used to remove an oxidized portion of the electrode material.

18. An apparatus, comprising:
    a high aspect ratio semiconductor structure having:
    a borophosphosilicate glass (BPSG) material on a working material;
    a first nitride material on the BPSG material;
    a tetraethyl orthosilicate (TEOS) material on the first nitride material; and
    a second nitride material on the TEOS material;
    an opening formed through the semiconductor structure; and
    a bottom electrode material formed within the opening wherein an upper portion of the bottom electrode material is reduced using a controlled oxidative trim.

19. The apparatus of claim 18, wherein a supercritical drying vapor etch is used to remove an oxidized portion of the electrode material.

20. The apparatus of claim 18, wherein a plasma-based chemistry is used to reduce the bottom electrode material using a vapor etch mixture of nitrogen, argon or a combination of nitrogen and argon.

21. The apparatus of claim 18, wherein the combination of the BPSG material, the first nitride material, the TEOS material, and the second nitride material are formed to a height of greater than 10,000 Angstroms.

22. The apparatus of claim 18, wherein the first and the second nitride materials are formed from a silicon nitride (SiN) material.

23. The apparatus of claim 18, wherein the upper portion of the bottom electrode material has a bulge formed during a dry etch of a high aspect ratio pillar.

24. The apparatus of claim 18, wherein the TEOS material has a height between 2,500 Angstroms and 4,500 Angstroms.

25. The apparatus of claim 18, wherein the first and second nitride material to a height between 50 Angstroms and 600 Angstroms.

26. The apparatus of claim 18, wherein the BPSG has a height between 2,000 Angstroms and 6,000 Angstroms.

* * * * *